(12) United States Patent
Filippov et al.

(10) Patent No.: US 9,670,753 B2
(45) Date of Patent: Jun. 6, 2017

(54) OPTIMIZED ACIDIZING OF PRODUCTION AND INJECTION WELLS

(71) Applicant: Landmark Graphics Corporation, Houston, TX (US)

(72) Inventors: Andrey Filippov, Houston, TX (US); Vitaly Khoriakov, Calgary (CA)

(73) Assignee: LANDMARK GRAPHICS CORPORATION, Houston, TX (US)

( * ) Notice: Subject to any disclaimer, the term of this patent is extended or adjusted under 35 U.S.C. 154(b) by 0 days.

(21) Appl. No.: 14/770,450

(22) PCT Filed: Oct. 1, 2014

(86) PCT No.: PCT/US2014/058629
§ 371 (c)(1),
(2) Date: Aug. 25, 2015

(87) PCT Pub. No.: WO2015/112208
PCT Pub. Date: Jul. 30, 2015

(65) Prior Publication Data
US 2016/0319639 A1 Nov. 3, 2016

Related U.S. Application Data (60) Provisional application No. 61/931,248, filed on Jan. 24, 2014.

(51) Int. Cl.
| | |
|---|---|
| *G06G 7/48* | (2006.01) |
| *E21B 41/00* | (2006.01) |
| *E21B 43/26* | (2006.01) |
| *E21B 43/25* | (2006.01) |
| *E21B 49/00* | (2006.01) |

(Continued)

(52) U.S. Cl.
CPC .......... *E21B 41/0092* (2013.01); *E21B 43/25* (2013.01); *E21B 43/26* (2013.01); *E21B 49/00* (2013.01); *G06F 17/5086* (2013.01); *C09K 8/72* (2013.01)

(58) Field of Classification Search
None
See application file for complete search history.

(56) References Cited

U.S. PATENT DOCUMENTS

| | | |
|---|---|---|
| 5,431,227 A | 7/1995 | Montgomery et al. |
| 6,101,447 A | 8/2000 | Poe, Jr. |

(Continued)

FOREIGN PATENT DOCUMENTS

| | | |
|---|---|---|
| WO | WO-2015016932 A1 | 2/2015 |
| WO | WO-2015073030 A1 | 5/2015 |

OTHER PUBLICATIONS

Glasbergen, Gerard et al., "Improved Acid Diversion Design Using a Placement Simulator", Oct. 3-6, 2006, SPE Russian Oil and Gas Technical COnference and Exhibition, Society of Petroleum Engineer.*

(Continued)

*Primary Examiner* — Cedric D Johnson (57) ABSTRACT

A system, computer program product, and computer implemented method are provided for determining an optimal acidizing placement design which would yield a prescribed profile of injection or production rate that accounts for the drawdown from heel to toe and reservoir heterogeneity and thereby improve hydrocarbon recovery.

17 Claims, 11 Drawing Sheets

(51) Int. Cl.
  *G06F 17/50*   (2006.01)
  *C09K 8/72*    (2006.01)

(56) References Cited

U.S. PATENT DOCUMENTS

| | | |
|---|---|---|
| 6,196,318 B1 | 3/2001 | Gong et al. |
| 2008/0015832 A1* | 1/2008 | Tardy ............... E21B 43/25 703/10 |
| 2008/0134775 A1 | 6/2008 | Pipchuk et al. |
| 2011/0011595 A1* | 1/2011 | Huang ............... E21B 43/00 166/369 |

OTHER PUBLICATIONS

Fernandes, P.D. et al., "A New IOR Technology to Homogenize Horizontal Well Injectivity/Productivity Profile", Apr. 22-26, 2006, SPE/DOE Symposium on Improved Oil Recovery, Society of Petroleum Engineers.*

Nokazi, Manabu, "A Placement Model for Matrix Acidizing of Vertically Extensive Multilayer Gas Reservoirs", Aug. 2008, Office of Graduate Studies in Petroleum Engineering, Texas A&M University.*

Eckerfield, L.D. et al., "Fluid Placement Model for Horizontal-Well Stimulation", Sep. 2000, SPE Drill & Completion 15 (3), Society of Petroleum Engineers.*

Mishra, Varun et al. "An Acid-Placement Model for Long Horizontal Wells in Carbonate Resevoirs", May 30-Jun. 1, 2007, European Formation Damage Conference, Society of Petroleum Engineers.*

Fadele, O. et al., "Matrix Acidizing in Gas Wells", Apr. 3-5, 2000, SPECERI Gas Technology Symposium, Society of Petroleum Engineers.*

International Search Report and Written Opinion, Feb. 16, 2015, 10 pages; Korean International Searching Authority.

Duverney, E.S. and Robles, F., Relative-Permeability Modifiers and their us in acid stimulation in HP/HT low-permeability carbonate formations: offshore Mexico cases, 2007, 9 pages, SPE 107584.

Hill, A.D. Androssen, W.R., Fluid placement and diversion in matrix acidizing, 1994, 13 pages, SPE 27982.

* cited by examiner

Fig. 11

# OPTIMIZED ACIDIZING OF PRODUCTION AND INJECTION WELLS

CROSS-REFERENCE TO RELATED APPLICATIONS

The present application is a U.S. National Stage patent application of International Patent Application No. PCT/US2014/058629, filed on Oct. 1, 2014, which claims the benefit of U.S. Provisional Patent Application No. 61/931,248, filed on Jan. 24, 2014, titled "Optimized Acidizing of Production and Injection Wells," the benefit of both of which are claimed and the disclosure of both of which are incorporated herein by reference in their entirety.

BACKGROUND

1. Field of the Disclosure

The present disclosure relates generally to the recovery of subterranean deposits and more specifically to methods and systems for improving production of an oil well by optimizing acidizing of production and injection wells.

2. Discussion of the Related Art

Matrix acidizing is a widely used technique to stimulate wells for improved inflow performance. In a sandstone acidizing, an acid solution is injected into the formation to increase permeability by dissolving minerals clogging the sandstone pores and removing damage to the near-well formation during drilling and well completion processes. Acidizing can yield substantial increase in near-well permeability and, correspondingly, higher production rates.

Modern methods of acid placement allow targeted delivery of acid to cover all of the production intervals. Usually, the goal is to achieve a uniform acid placement along the wellbore. However, due to the frictional pressure drop and reservoir permeability variations along the well, a uniform acidizing can yield non-uniform oil flux at the pipe wall and higher production flow rates at the heel.

BRIEF DESCRIPTION OF THE DRAWINGS

Illustrative embodiments of the present disclosure are described in detail below with reference to the attached drawing figures, which are incorporated by reference herein and wherein.

DETAILED DESCRIPTION

Embodiments of the present disclosure relate to optimizing acidizing treatments of production and injection wells. As stated above, the frictional pressure drop in a wellbore and reservoir permeability variations result in non-uniform drawdown pressure along the well length and higher production flow rate at the heel. To address such issues and thereby improve hydrocarbon recovery, the disclosed embodiments include systems and methods that use variable, non-uniform acid placement design to account for the drawdown from heel to toe and reservoir heterogeneity. For instance, in one embodiment, a mathematical model may be implemented in computer code and used to determine an optimal placement of one or more acid injection sites that would yield a prescribed profile of injection or production rate for a particular well.

The disclosed embodiments and advantages thereof are best understood by referring to FIGS. 1-11 of the drawings, with like reference numerals being used for like and corresponding parts of the various drawings. Other features and advantages of the disclosed embodiments will be or will become apparent to one of ordinary skill in the art upon examination of the following figures and detailed description. It is intended that all such additional features and advantages be included within the scope of the disclosed embodiments. Further, the illustrated figures are only exemplary and are not intended to assert or imply any limitation with regard to the environment, architecture, design, or process in which different embodiments may be implemented.

As used herein, the singular forms "a", "an" and "the" are intended to include the plural forms as well, unless the context clearly indicates otherwise. It will be further understood that the terms "comprise" and/or "comprising," when used in this specification and/or the claims, specify the presence of stated features, integers, steps, operations, elements, and/or components, but do not preclude the presence or addition of one or more other features, integers, steps, operations, elements, components, and/or groups thereof. The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the examples and embodiments in the form disclosed. Many modifications and variations will be apparent to those of ordinary skill in the art without departing from the scope and spirit of this disclosure. The illustrative embodiments were chosen and described herein for explanatory purposes in the context of practical applications, and to enable others of ordinary skill in the art to understand that the disclosed embodiments may be modified as desired for a particular implementation or use. The scope of the claims is intended to broadly cover the disclosed embodiments and any such modification.

Figure 1:
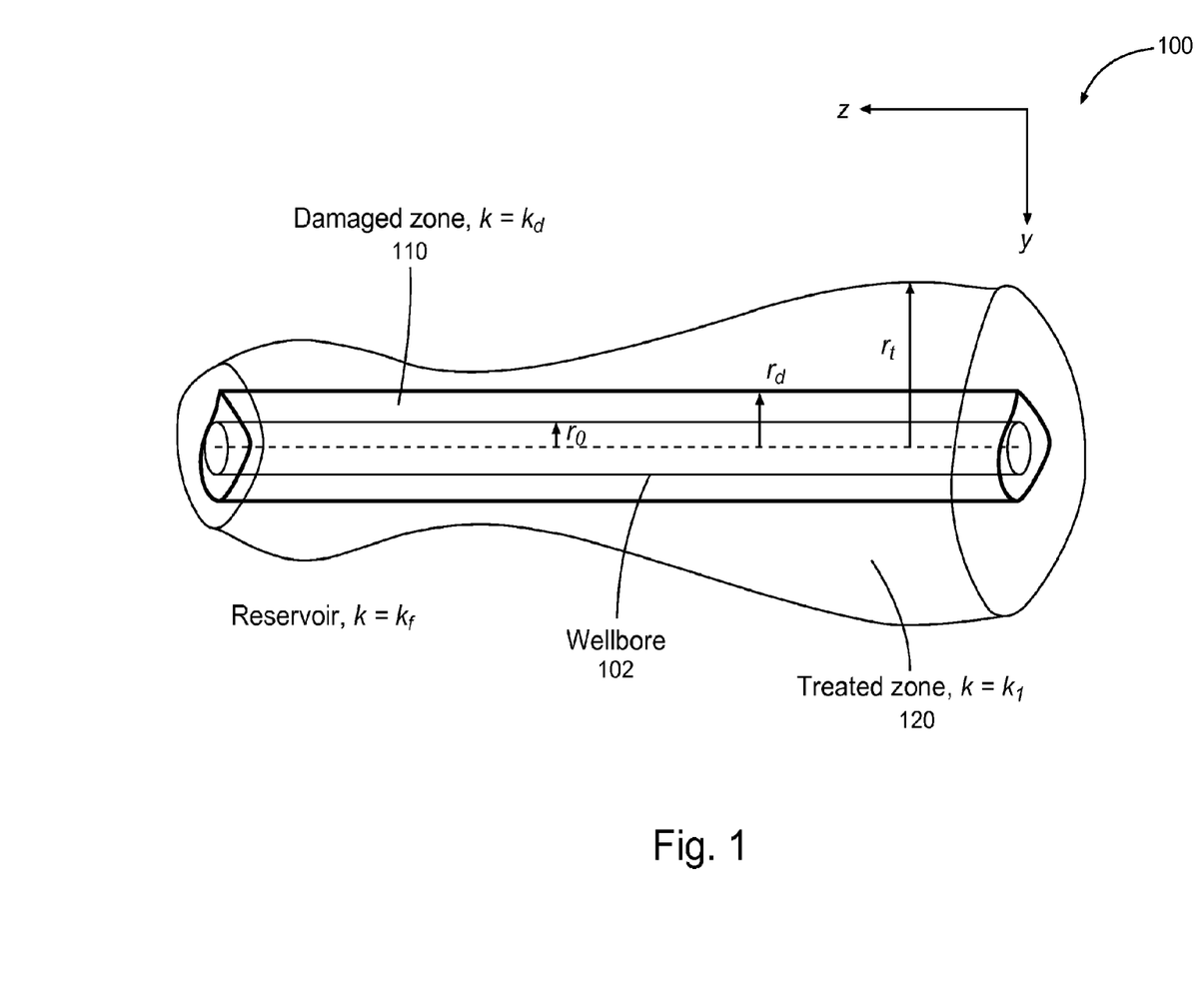
FIG. 1 is a diagram illustrating an example of a horizontal well within a reservoir formation with damaged, treated and undamaged formation zones, in accordance with an embodiment.

Referring now to FIG. 1, an example of a reservoir formation 100 is presented with various formation zones representing damaged, treated and undamaged regions in different layers of the formation. The reservoir formation in this example may be, for example, a sandstone formation or similar type of rock formation. In the depicted embodiment, a horizontal well 102 within formation 100 has an external radius $r_0$ and extends through the formation along an axis z. It is assumed for purposes of this example that the axis z of well 102 is also the radial symmetry axis of the matrix acidizing system disclosed herein. As shown in FIG. 1, well 102 is surrounded by a damaged zone 110 representing a damaged layer $r<r_d$ of formation 100. The damaged layer may be a result of, for example, particle damage due to drilling and completions (e.g. mud solids invasion). Because of pore clogging caused by such damage, the permeability $k_d$ of the damaged zone 110 may be substantially lower than the permeability $k_f$ of undamaged layers of formation 100. The placement of an acid treatment in a treatment zone 120 in a layer $r<r_f(z)$ of formation 100 may help to clear naturally occurring host minerals, such as carbonates, from the damaged zone 110 and from pores in the undamaged formation zones.

The permeability of a rock matrix is generally a product of the absolute permeability and relative permeability. Relative permeability is a property of the fluid under consideration. For discussion purposes, the relative permeability of fluids in the examples described herein are considered constant.

Figure 2A:
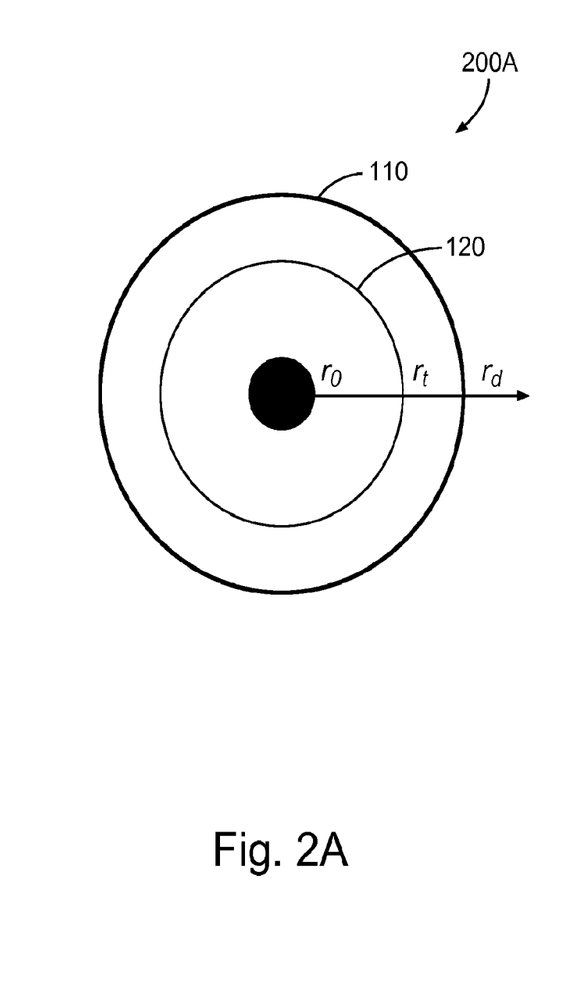
FIGS. 2A and 2B are diagrams illustrating examples of partial and full coverage of a damaged zone, in accordance with an embodiment.
Figure 2B:
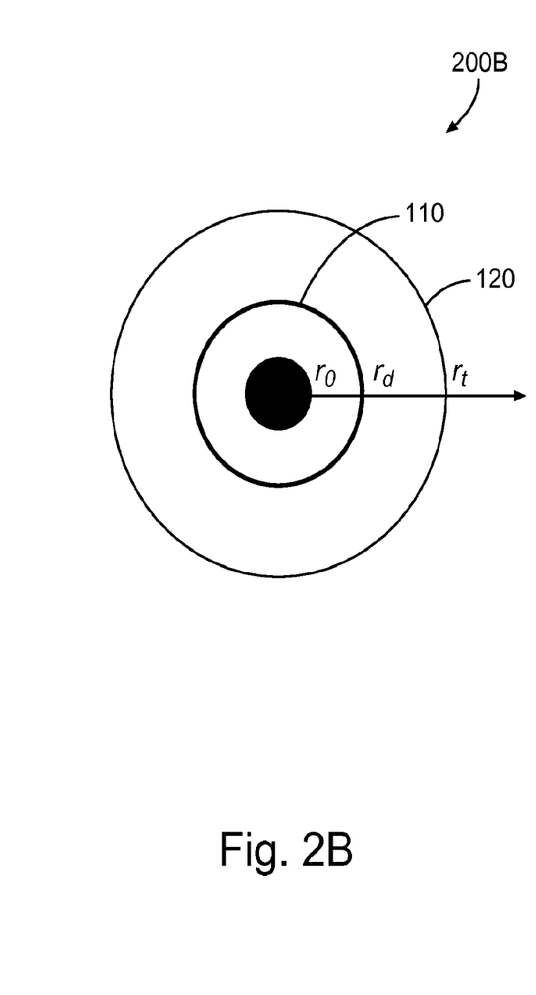

As a result of acidizing, the permeability $k_t$ in the treatment zone 120 can be substantially higher than the initial formation permeability $k_f$. Depending on the volume of the injected acid, the treatment zone 120 (with a radius $r_t$) can cover the damaged zone 110 (with a radius $r_d$) either partially or fully. FIG. 2A illustrates a view 200A of the formation zones of reservoir 100 in which the treatment zone 120 only partially covers the damage zone 110 (i.e., $r_t<r_d$). FIG. 2B illustrates a view 200B of the formation zones in which the treatment zone 120 fully covers the damaged zone 120 (i.e., $r_d<r_t$) and extends into the undamaged formation.

The pressure distribution in the wellbore may be described by the set of Equations (1-5) as follows:

$$\frac{dq}{dz} = J; q = \rho V A \tag{1}$$

$$\frac{dp}{dz}\frac{1}{2D}\text{sgn}(p - p_B)f_d\rho V^2; z = 0; q = 0; p = p_s \tag{2}$$

$$r_t < r_d: J = \frac{2\pi|p_B - p|}{\mu}\left[\frac{1}{k_1}\ln\left(\frac{r_t}{r_0}\right) + \frac{1}{k_d}\ln\left(\frac{r_d}{r_t}\right) + \frac{1}{k_f}\ln\left(\frac{r_B}{r_d}\right)\right]^{-1} \tag{3}$$

$$r_t \geq r_d: J = \frac{2\pi|p_B - p|}{\mu}\left[\frac{1}{k_t}\ln\left(\frac{r_t}{r_0}\right) + \frac{1}{k_f}\ln\left(\frac{r_B}{r_t}\right)\right]^{-1} \tag{4}$$

$$r_t = f(z)r_m; \frac{r_0}{r_m} \leq f(z) \leq 1 \tag{5}$$

where μ is the viscosity, p is the pressure in the wellbore, ρ is the density of the injected or produced liquid, V is the velocity, A is the inner cross-section area of the wellbore, q is the mass flow rate, J is the linear density of the injection/production flow rate, $f_d$ is the Darcy friction coefficient, $r_m$ is a characteristic radial distance from the well center to the boundary of the treatment zone 120, and $r_B$ is the radial distance to the reservoir boundary.

As shown in FIG. 1, it is assumed that the axial coordinate z of well 102 in this example starts at the toe of the well 102. In an embodiment, when the pressure p in the wellbore is higher than the reservoir pressure $p_B$, fluid injection occurs, otherwise, the well 102 works as a producer. Initial conditions at the toe of the well 102 are described by Equation (3) above. Equation (4) describes the formation hydrodynamic resistance in a situation when the treatment zone 120 covers only a part of the damaged formation represented by damage zone 110, as shown in FIG. 2A. Equation (5) represents the alternative situation, when the treatment zone 120 fully covers damaged zone 110 and extends into the undamaged reservoir, as shown in FIG. 2B. In an embodiment, an acid placement function $f(z)$ represents an optimal shape of the treatment zone 120 for a desired production and/or injection flow rate for well 102. Function $f(z)$ may characterize the optimal placement of acid treatments along well 102 so as to yield a prescribed profile for injection and/or production flow rates. As such, knowledge of the function $f(z)$, according to Equation (5) above, may be the same as knowledge of the distribution $r_t(z)$ of the treatment zone 120 radius.

In an embodiment, equations (4) and (5) may be inverted to determine the function $f(z)$ based on a predetermined distribution $J(z)$ of the injection/production flow rate density, as shown by the following set of Equations (6-9):

$$J < J_c: f = \frac{r_0}{r_m}\exp\left\{\frac{1}{(\gamma_t - \gamma_d)}\left[\frac{2\pi k_f|p_B - p|}{J(z)\mu} - (\gamma_d - 1)\ln\left(\frac{r_d}{r_0}\right) - \ln\left(\frac{r_B}{r_0}\right)\right]\right\} \tag{6}$$

$$J \geq J_c: f = \frac{r_0}{r_m}\exp\left\{\frac{1}{(\gamma_t - 1)}\left[\frac{2\pi k_f|p_B - p|}{J(z)\mu} - \ln\left(\frac{r_B}{r_0}\right)\right]\right\} \tag{7}$$

$$J_c = \frac{2\pi k_f|p_B - p|}{\mu}\left[(\gamma_t - 1)\ln\left(\frac{r_d}{r_0}\right) + \ln\left(\frac{r_B}{r_0}\right)\right]^{-1} \tag{8}$$

$$\gamma_t = \frac{k_f}{k_t}; \gamma_d = \frac{k_f}{k_d} \tag{9}$$

In an embodiment, Equations (6-9) may be used in the acid treatment optimization techniques disclosed herein. As will be described in further detail below, such optimization techniques may include using function $f(z)$ to determine an optimal acid placement. In an embodiment, the optimal acid placement may yield an optimal shape of the treatment zone 120 according to the prescribed injection/production rate profile. The optimal acid placement in this example may be determined such that the injection/production mass flux density satisfies Equation (10):

$$J(z) = J(z_0)\frac{F(z)}{F(z_0)} \tag{10}$$

where F(z) is a target shape function of coordinate z, and $z_0$ is some predetermined position along the wellbore.

In an example, the function F(z) may be constant for a uniform target injection or production profile. Once the size and shape of the treatment zone 120 is determined, the placement of acid along the well 102, e.g., in units of mass per unit length, can be calculated based on the formation properties and chemical contents of the clogging material, as will be described in further detail below with reference to FIG. 3.

Figure 3:
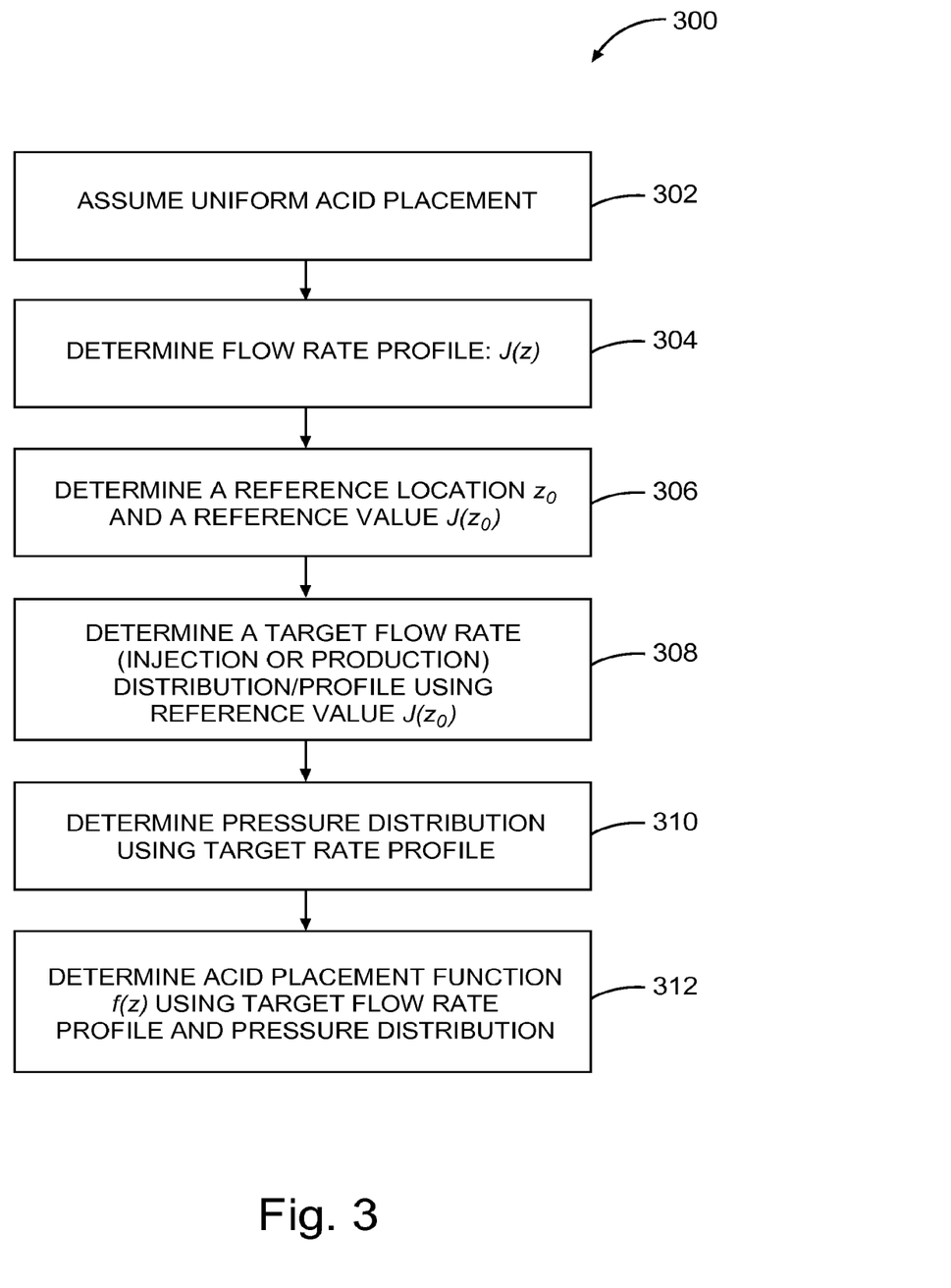
FIG. 3 is a process flowchart of an exemplary method for performing an acidizing optimization technique, in accordance with an embodiment.

FIG. 3 is a process flowchart of an exemplary method 300 for acid placement optimization. For purposes of discussion, method 300 will be described using the reservoir formation 100 and horizontal well 102 of FIG. 1, as described above. However, method 300 is not intended to be limited thereto. As described above, a goal of the acid placement optimization techniques disclosed herein is to find an optimal acid placement, characterized by function $f(z)$, which yields to a prescribed shape of the injection/production flow rate profile J. The injection/production flow rate profile in his example may be characterized by the shape function F(z), such that $J(z)=J_0 F(z)/F(z_0)$, where $J_0$ is a constant.

As shown in FIG. 3, method 300 begins in step 302 by assuming a uniform initial acid placement $f(z)=1$ along the horizontal length of the wellbore, e.g., along axis z of well 102 of FIG. 1, as described above. This also assumes that the radial distance of the boundary of the treatment zone $r_t(z)$ from the well center is constant along the well. The uniform initial acid placement may be expressed using Equation (11) as follows:

$$f(z)=f_0(z)=1; 0 \leq z \leq L_z \quad (11)$$

where z is the horizontal coordinate axis and Lz is the wellbore length.

In step 304, an injection/production flow rate profile J(z) along the horizontal production length of the wellbore is determined based on numerical solutions of the first set of Equations (1-5) with the treatment profile $r_t(z)=f(z)*r_m$ as described above.

Step 306 includes determining a reference location or point $z=z_0$ along the horizontal length of the wellbore that satisfies a condition of having a minimum ratio between a current injection/production front and a target injection/production front, as expressed by Equation (12):

$$\frac{J(z_0)}{F(z_0)} = \min\left[\frac{J(z)}{F(z)}\right]; 0 \leq z \leq L_z \quad (12)$$

The value $J(z_0)$ in Equation (12) above may serve as a reference value for calculating a target injection/production flow rate distribution or profile $J_{tar}(z)$ in step 308. In one embodiment, step 308 may include defining the target injection/production profile based on the reference value $J(z_0)$, e.g., in accordance with Equation (13):

$$J_{tar}(z) = J(z_0)\frac{F(z)}{F(z_0)} \quad (13)$$

In step 310, the pressure distribution p(z) is determined using the target injection/production profile defined in step 308. For example, the pressure distribution in step 310 may be determined using Equations (1) and (2) above with a known injection/production mass flow rate $J=J_{tar}(z)$.

In step 312, the acid placement function $f(z)$ may be determined based on the target injection/production profile $J_{tar}(z)$ and the fluid pressure distribution p(z). For example, the acid placement profile function $f(z)$ may be determined using the second set of Equations (6-9), as described above.

To help further describe the disclosed embodiments, FIGS. 4-10 illustrate four examples that demonstrate various practical applications of the disclosed techniques, e.g., as described above with respect to method 300 of FIG. 3. In the given examples, it is assumed that the horizontal well has an external diameter 0.114 m and length 2500 m in a sandstone formation. It is also assumed that in production mode, the well produces oil that has a density of approximately 850 kg/m$^3$ and a viscosity of 0.01 Pa s. In stimulation mode, it is assumed that the injection fluid includes water with a density of approximately 1000 kg/m$^3$ and a viscosity of 0.001 Pa s. It is further assumed for purposes of the following examples that the well is surrounded by a damaged layer that has a thickness of 0.105 m and a permeability that is about 25% of the permeability value of the undamaged formation layers. In an embodiment, a treatment zone of a certain width $r_t$-$r_0$ may have a permeability value that is twice as much as the formation permeability due to the pore clean-up resulting from the acidizing treatment process. The characteristic width of the treatment zone $r_m$-$r_0$ may be, for example, 0.71 m. Further, for purposes of the following example, it is assumed that the reservoir boundary pressure $p_B$ is set to a constant value of 25 bars.

Figure 4:
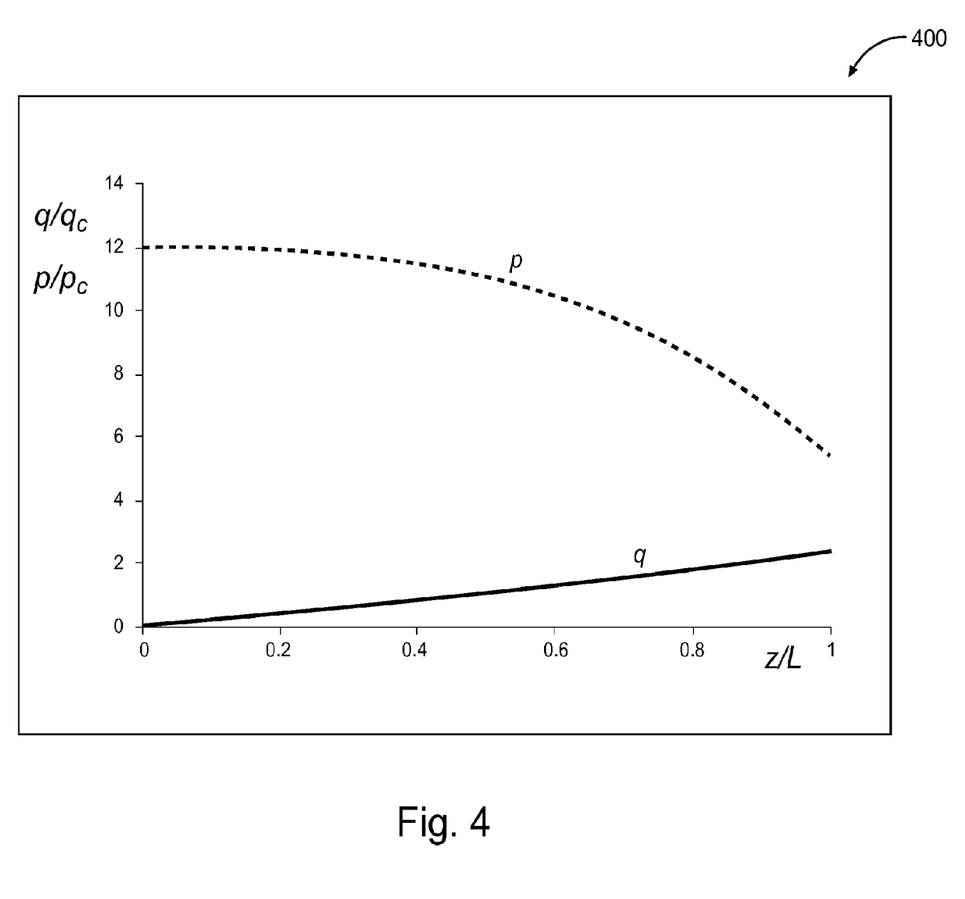
FIG. 4 is a graph that illustrates an example of a variation of pressure p and mass flow rate q along a wellbore, in accordance with an embodiment.
Figure 5:
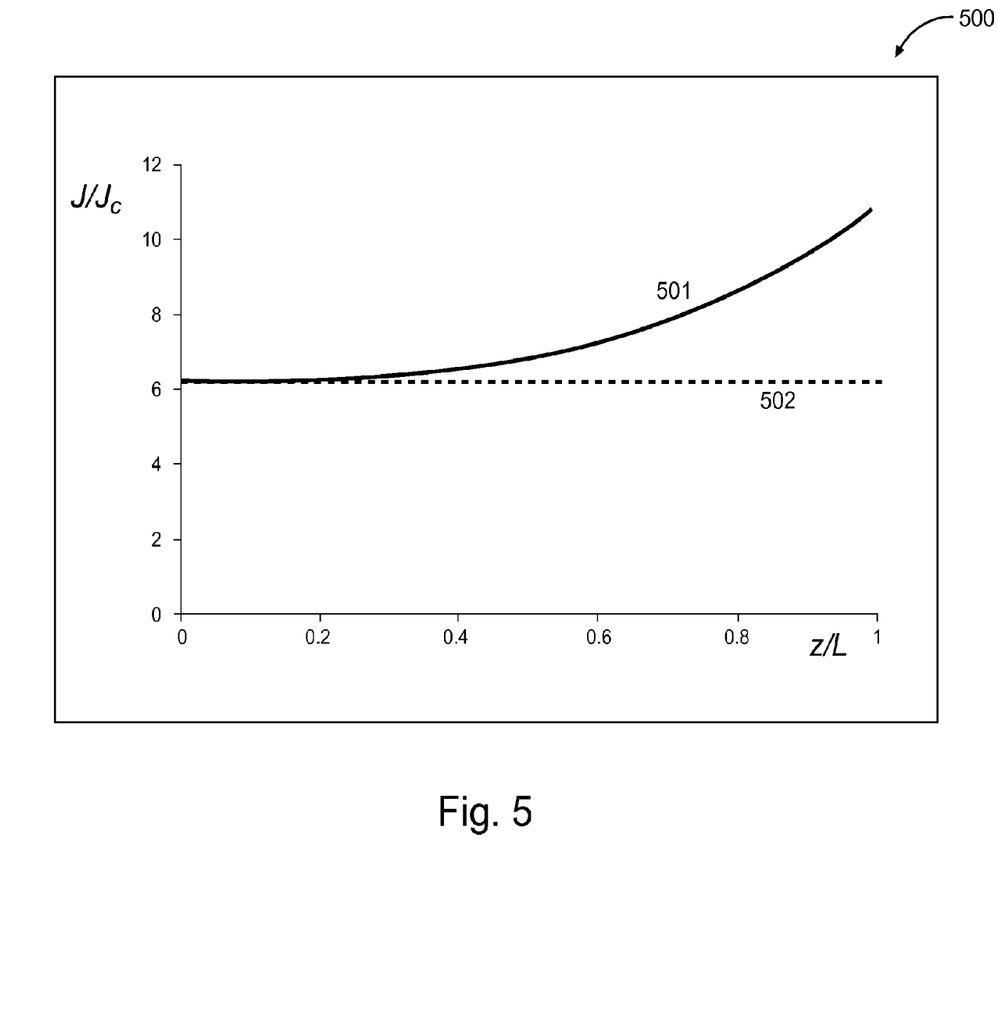
FIG. 5 is a graph that illustrates an example of a distribution of production flux for a uniform acidizing treatment relative to that of an optimized acidizing treatment, in accordance with an embodiment.

FIGS. 4 and 5 are used to illustrate an example of applying the disclosed techniques to a uniform reservoir formation with a uniform target production flux. In this example, a production well is assumed to have a pressure of 12 bars at its toe. It is also assumed that the permeability of undamaged formation layer or zone is uniform and equal to 0.1 Darcy. It is further assumed that the target production mass flow J is constant along the well and that the pressure drops in the direction from toe (z=0) to heel (z=L). In FIG. 4, a graph 400 shows exemplary profiles of the pressure p(z) and mass flow rate q(z) variations in the well. In an embodiment, the pressure and flow rate data may be normalized based on corresponding values that may be characteristic to the particular well or formation, e.g., a characteristic pressure $p_c$=1 bar and a characteristic mass flow rate $q_c$=8.94 kg/s.

FIG. 5 is a graph 500 illustrating an exemplary distribution of production flux in the case of uniform acidizing (line 501) and optimized acidizing (line 502). Because drawdown pressure $p_B$-p increases in the direction of the heel, the production inflow nearly doubles in this area (12 vs. 6) when compared to the toe, as shown by line 501 of graph 500 in FIG. 5. In order to yield a uniform production flux (line 502 in FIG. 5), the shape of the treated area, represented by function $f(z)$, can be tuned, in accordance with an embodiment.

In this example, the application of the disclosed optimization techniques, e.g., as described above with respect to method 300 of FIG. 3, may yield the optimal placement function $f(z)$, as represented by line 501 in FIG. 5. In the part of the well to the right of the breakpoint around z/L=0.75, a part of the damaged zone may need to be left untreated in order to compensate for any drawback pressure increases in the direction of the flow. The resulting production flux may be constant along the well, as illustrated by line 502 in FIG. 5.

Figure 6:
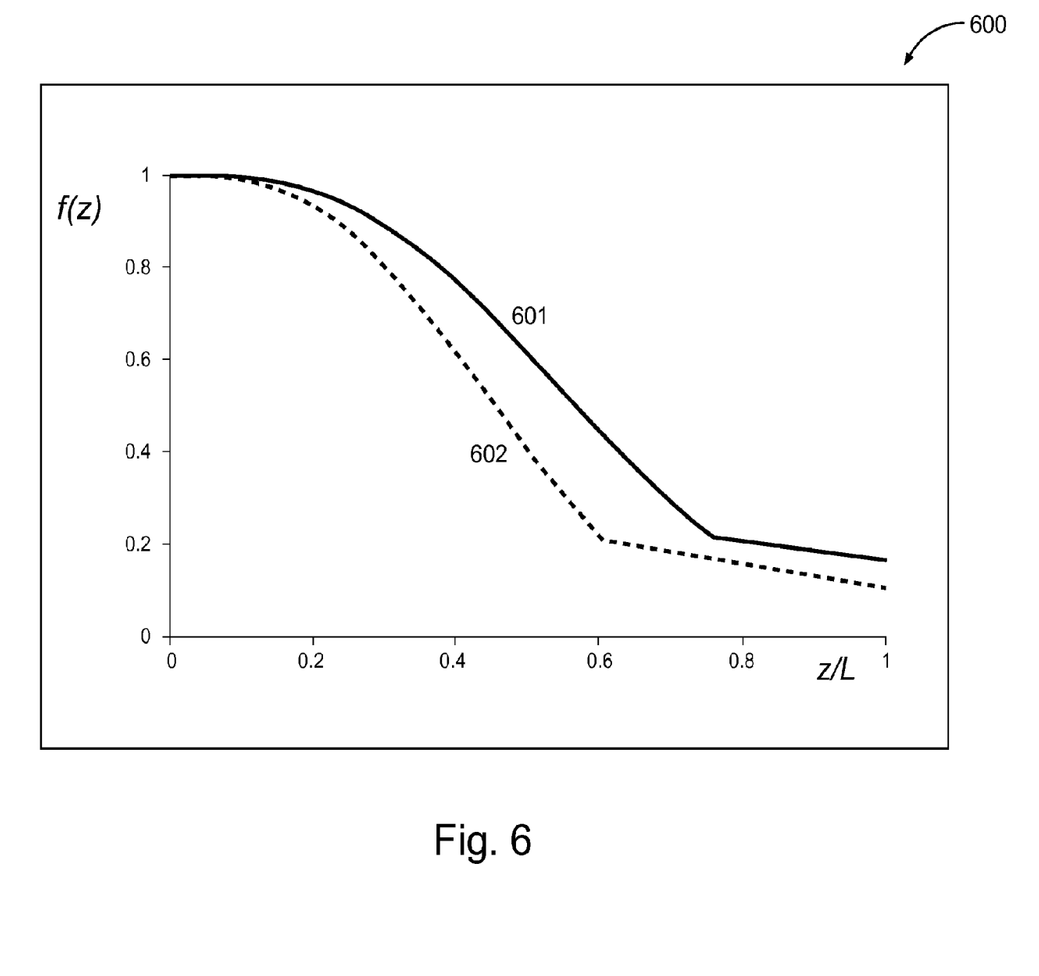
FIG. 6 is a graph that illustrates an example of an acid placement function $f(z)$, representing the optimal shape of the treatment zone, for production (line 1) and injection (line 2) scenarios on the same well, in accordance with an embodiment.

FIG. 6 illustrates a second example in which the disclosed techniques are applied to a uniform formation with a uniform target injection flux. As shown in FIG. 6, a graph 600 shows an acid placement function $f(z)$ representing an optimal shape of the treatment zone (e.g., treatment zone 120 of FIG. 1, as described above) in both production (line 601) and injection (line 602) scenarios for the same well. In this example, it is assumed that the well is used for water injection with a pressure of 27 bars at the toe. It is also assumed that the permeability of the undamaged formation layer or zone is uniform and equal to 0.15 Darcy, and that the injection mass flux J is constant along the well. Uniform acidizing ($f(z)=1$) in this example would yield higher flow pressure and higher injection flow rate distributions near the heel of the well, similar to the uniform production flux distribution shown by line 501 in graph 500 of FIG. 5. The disclosed techniques may be used to determine the optimal acid placement function $f(z)$ that would yield the uniform injection rate, as shown by line 602 in graph 600 of FIG. 6.

Figure 7:
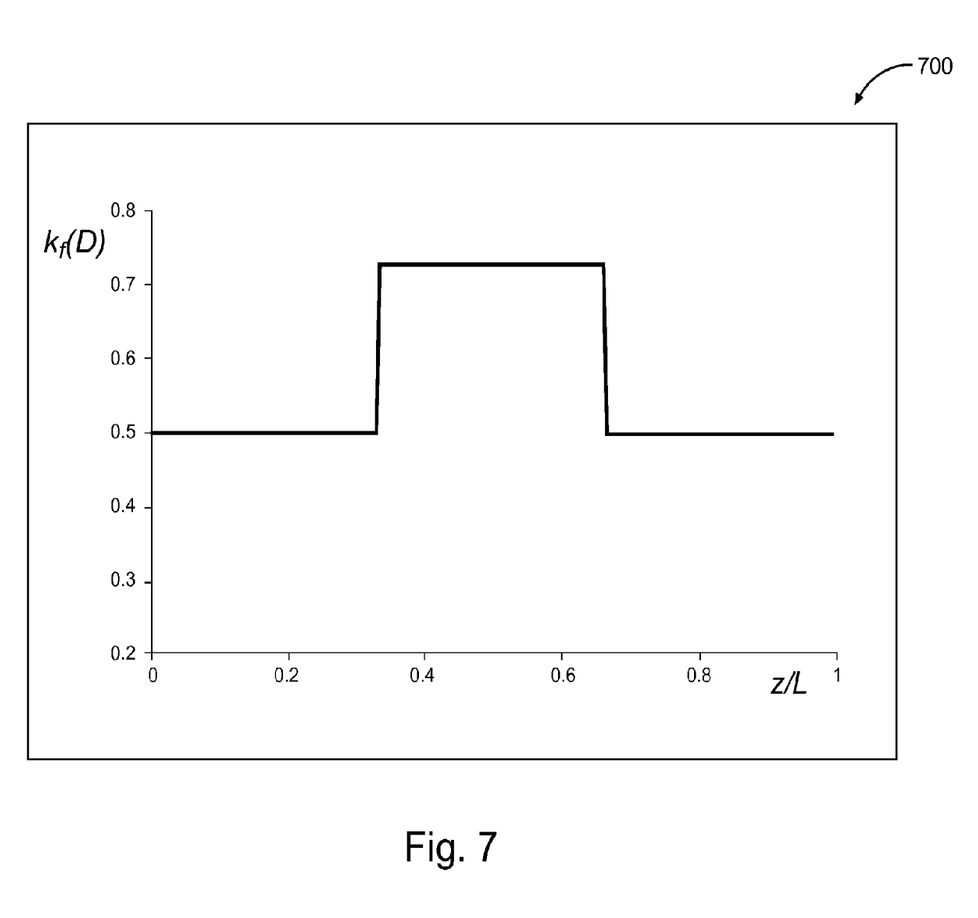
FIG. 7 is a graph that illustrates an example of a non-uniform distribution of the formation permeability $k_f$, in accordance with an embodiment.
Figure 8:
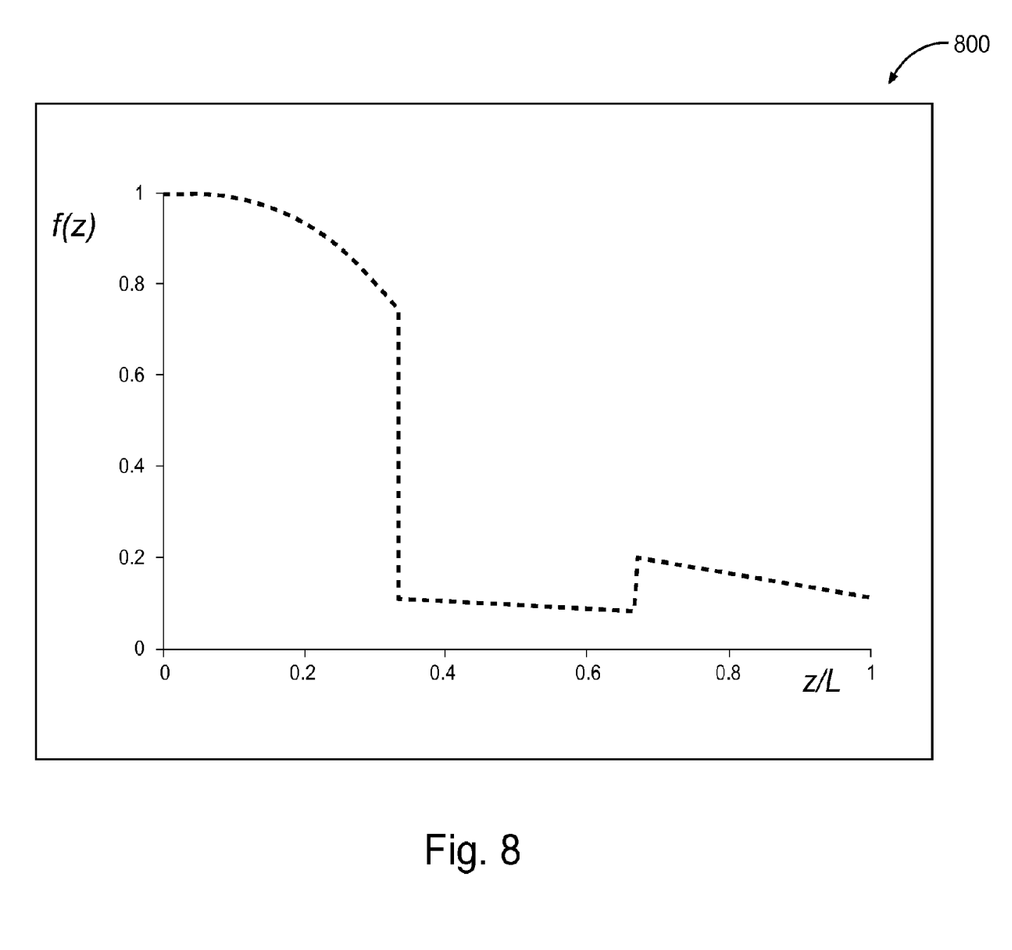
FIG. 8 is a graph that illustrates an example of the acid placement function $f(z)$, yielding a constant production flux $J(z)$, in accordance with an embodiment.

FIGS. 7 and 8 illustrate a third example in which the disclosed techniques are applied to a non-uniform formation with a uniform target production flow. In this example, the well is used for production with parameters identical to those in the first example described above and illustrated in FIGS. 4 and 5, with exception of the non-uniform undamaged permeability $k_f$, for which the variation along the well length is shown in graph 700 of FIG. 7. The application of the techniques disclosed herein results in the acid placement function $f(z)$ shown in graph 800 of FIG. 8, which yields a constant production flux J(z). The results shown in FIG. 8 indicate that very little formation acidizing is needed in the middle part of the well, where permeability is the highest, or around the heel area, where the pressure is highest.

Figure 9:
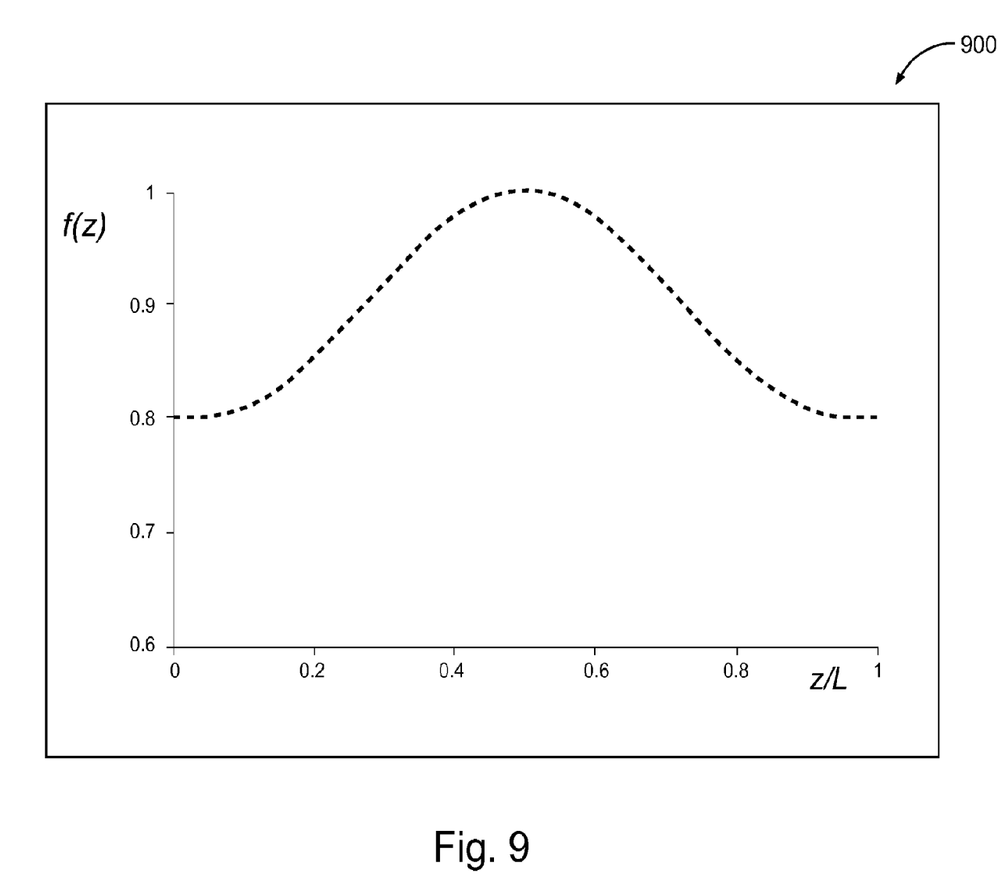
FIG. 9 is a graph that illustrates an example of a non-uniform target shape of the production flux, in accordance with an embodiment.
Figure 10:
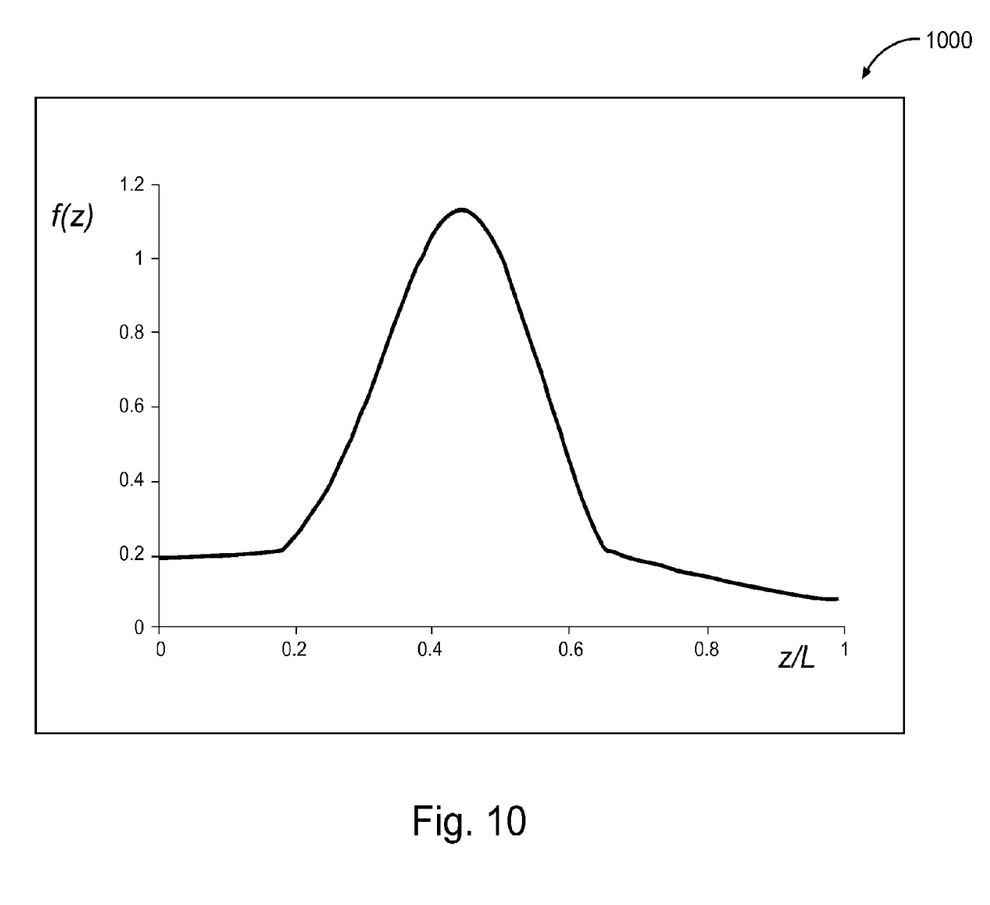
FIG. 10 is a graph that illustrates an example of the acid placement function $f(z)$, yielding the bell shape of the production flux, in accordance with an embodiment.

FIGS. 9 and 10 illustrate a fourth example in which the disclosed techniques are applied to a uniform formation with a non-uniform target production flow. It is assumed that the well and formation parameters in this example are identical to those in the first example described above with respect to FIGS. 4 and 5, with the exception of the non-uniform target production influx, for which the variation along the well length is shown by a graph 900 in FIG. 9. The application of the disclosed techniques, e.g., as described above with respect to method 300 of FIG. 3, may result in the acid placement function $f(z)$ shown by a graph 1000 in FIG. 10. Graph 1000 shows how enhanced acidizing in the middle part of the well can yield the target bell shape of the production flux F(z).

Figure 11:
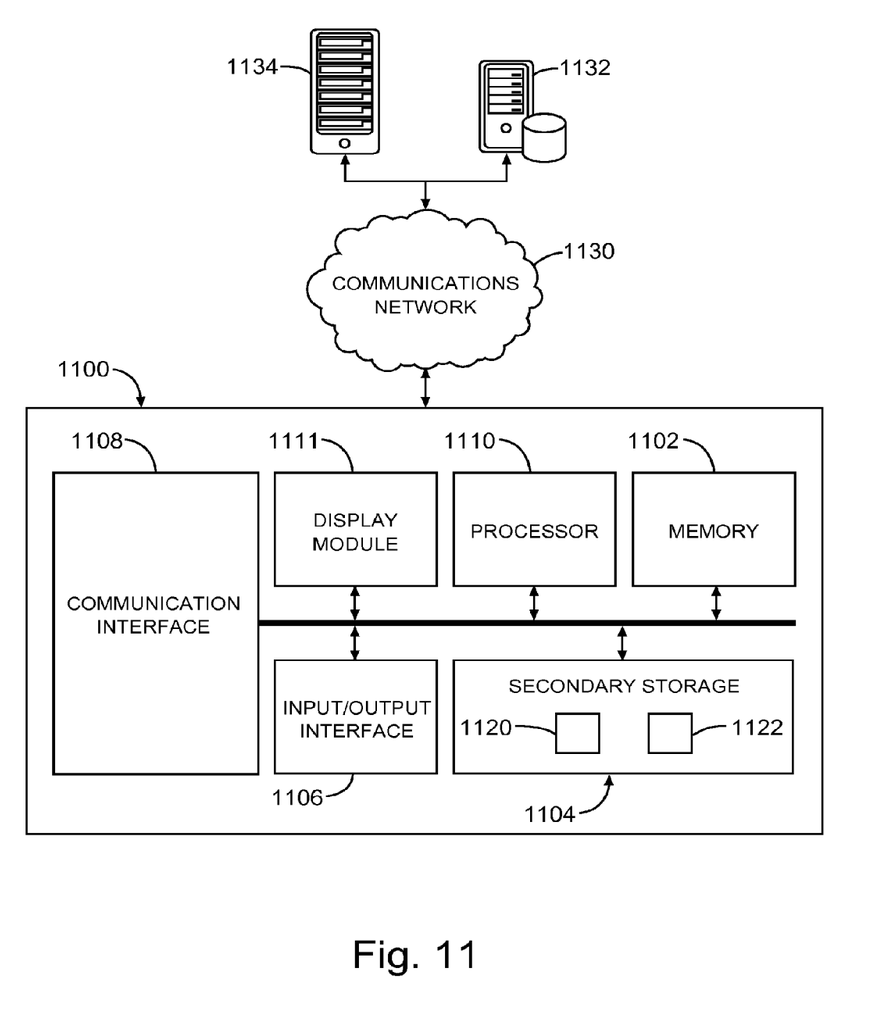
FIG. 11 is a block diagram illustrating an exemplary computer system for implementing the disclosed embodiments.

Referring now to FIG. 11, a block diagram illustrating one embodiment of a system 1100 for implementing the features and functions of the disclosed embodiments is presented. The system 1100 may be any type of computing device including, but not limited to, a desktop computer, a laptop, a server, a tablet, and a mobile device. The system 1100 includes, among other components, a processor 1110, main memory 1102, secondary storage unit 1104, an input/output interface module 1106, and a communication interface module 1108.

The processor 1110 may be any type or any number of single core or multi-core processors capable of executing instructions for performing the features and functions of the disclosed embodiments. The input/output interface module 1106 enables the system 1100 to receive user input (e.g., from a keyboard and mouse) and output information to one or more devices such as, but not limited to, printers, external data storage devices, and audio speakers. The system 1100 may optionally include a separate display module 1111 to enable information to be displayed on an integrated or external display device. For instance, the display module 1111 may include instructions or hardware (e.g., a graphics card or chip) for providing enhanced graphics, touchscreen, and/or multi-touch functionalitics associated with one or more display devices.

Main memory 1102 is volatile memory that stores currently executing instructions/data or instructions/data that are prefetched for execution. The secondary storage unit 1104 is non-volatile memory for storing persistent data. The secondary storage unit 1104 may be or include any type of data storage component such as a hard drive, a flash drive, or a memory card. In one embodiment, the secondary storage unit 1104 stores the computer executable code/instructions and other relevant data for enabling a user to perform the features and functions of the disclosed embodiments.

For example, in accordance with the disclosed embodiments, the secondary storage unit 1104 may permanently store the executable code/instructions of the above-described acidizing optimization algorithm 1120. The instructions associated with the acidizing optimization algorithm 1120 are then loaded from the secondary storage unit 1104 to main memory 1102 during execution by the processor 1110 for performing the disclosed embodiments. In addition, the secondary storage unit 1104 may store other executable code/instructions and data 1122 such as, but not limited to, a wellbore simulator application and/or a reservoir simulation application for use with the disclosed embodiments.

The communication interface module 1108 enables the system 1100 to communicate with the communications network 1130. For example, the network interface module 1108 may include a network interface card and/or a wireless transceiver for enabling the system 1100 to send and receive data through the communications network 1130 and/or directly with other devices.

The communications network 1130 may be any type of network including a combination of one or more of the following networks: a wide area network, a local area network, one or more private networks, the Internet, a telephone network such as the public switched telephone network (PSTN), one or more cellular networks, and wireless data networks. The communications network 1130 may include a plurality of network nodes (not depicted) such as routers, network access points/gateways, switches, DNS servers, proxy servers, and other network nodes for assisting in routing of data/communications between devices.

For example, in one embodiment, the system 1100 may interact with one or more servers 1134 or databases 1132 for performing the features of the disclosed embodiments. For instance, the system 1100 may query the database 1132 for well log information for creating a wellbore model in accordance with the disclosed embodiments. Further, in certain embodiments, the system 1100 may act as a server system for one or more client devices or a peer system for peer to peer communications or parallel processing with one or more devices/computing systems (e.g., clusters, grids).

Thus, the disclosed embodiments provide a novel and efficient reservoir-wellbore model for optimization of acid placement in injection and production wells, which can be applied to coupled wellbore-reservoir simulations of various complexity levels. The optimized acidizing will yield a uniform or prescribed production/injection profile along the wellbore. This model also considers variation of reservoir formation parameters and fluid properties, which has wide potential applications for different reservoir conditions (for example, injection into fractured reservoirs). Vertical-horizontal anisotropy of permeabilities can be accounted for by using effective permeabilities.

Additionally, the disclosed acidizing optimization algorithm can be a powerful tool for acid placement design and production optimization if assembled in the production simulation software package, e.g. NETool™. The suggested algorithm is optimized for a specific set of problems and is much simpler than a universal optimization method. Mathematically, it does not involve the Lagrange multipliers and is reduced to one simulation, which runs very fast. Another advantage is that it can be easily applied to any coupled wellbore-reservoir model, including the most complicated ones.

Still, another advantage is that the disclosed embodiments may be used in lieu of costly inflow control devices and/or may, in certain embodiments, used in conjunction with the use of inflow control devices to better address the issue of breakthrough and improve hydrocarbon recovery.

The foregoing methods and systems disclosed herein are particularly useful in optimizing acid placement for well treatments. In one embodiment of the present disclosure, a computer-implemented method for optimizing acid placement for well treatments includes: determining a flow rate profile of a well in a reservoir formation based on a uniform acid placement function; determining a reference location along a length of the well; determining a reference value based on the flow rate profile at the reference location along the length of the well; defining a target flow rate profile based on the reference value; determining a pressure distribution along the length of the well based on the target flow rate profile; and determining an acid placement function that yields a prescribed shape of the flow rate profile for the well based on the target flow rate profile and the pressure distribution.

In a further embodiment, the reference location along the length of the well satisfies a condition of having a minimum ratio between a current injection front and a target injection front. In yet a further embodiment, the target flow rate profile is a target injection profile. In yet a further embodiment, the target injection profile and a permeability of an undamaged portion of the reservoir formation are uniform. In yet a further embodiment, the reference location along the length of the well satisfies a condition of having a minimum ratio between a current production front and a target production front. In yet a further embodiment, the target flow rate profile is a target production profile. In yet a further embodiment, the target production profile and a permeability of an undamaged portion of the reservoir formation are uniform. In yet a further embodiment, the target production profile is uniform and a permeability of an undamaged portion of the reservoir formation is non-uniform. In yet a further embodiment, the target production profile is non-uniform and a permeability of an undamaged portion of the reservoir formation is uniform.

In another embodiment of the present disclosure, a system for optimizing acid placement for well treatments includes at least one processor; and a memory that is coupled to the at least one processor and that stores processor readable instructions, which when executed by the processor cause the processor to perform a plurality of operations, including operations to: determine a flow rate profile of a well in a reservoir formation based on a uniform acid placement function; determine a reference location along a length of the well; determine a reference value based on the flow rate profile at the reference location along the length of the well; define a target flow rate profile based on the reference value; determine a pressure distribution along the length of the well based on the target flow rate profile; and determine an acid placement function that yields a prescribed shape of the flow rate profile for the well based on the target flow rate profile and the pressure distribution.

In yet another embodiment of the present disclosure, a non-transitory computer readable medium has instructions stored therein, which when executed by a computer cause the computer to perform a plurality operations, including operations to: determine a flow rate profile of a well in a reservoir formation based on a uniform acid placement function; determine a reference location along a length of the well; determine a reference value based on the flow rate profile at the reference location along the length of the well; define a target flow rate profile based on the reference value; determine a pressure distribution along the length of the well based on the target flow rate profile; and determine an acid placement function that yields a prescribed shape of the flow rate profile for the well based on the target flow rate profile and the pressure distribution.

While specific details about the above embodiments have been described, the above hardware and software descriptions are intended merely as example embodiments and are not intended to limit the structure or implementation of the disclosed embodiments. For instance, although many other internal components of the system 1100 are not shown, those of ordinary skill in the art will appreciate that such components and their interconnection are well known.

In addition, certain aspects of the disclosed embodiments, as outlined above, may be embodied in software that is executed using one or more processing units/components. Program aspects of the technology may be thought of as "products" or "articles of manufacture" typically in the form of executable code and/or associated data that is carried on or embodied in a type of machine readable medium. Tangible non-transitory "storage" type media include any or all of the memory or other storage for the computers, processors or the like, or associated modules thereof, such as various semiconductor memories, tape drives, disk drives, optical or magnetic disks, and the like, which may provide storage at any time for the software programming.

Additionally, the flowchart and block diagrams in the figures illustrate the architecture, functionality, and operation of possible implementations of systems, methods and computer program products according to various embodiments of the present invention. It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The above specific example embodiments are not intended to limit the scope of the claims. The example embodiments may be modified by including, excluding, or combining one or more features or functions described in the disclosure.

What is claimed is:

1. A computer-implemented method for optimizing acid placement for well treatments, the method comprising:
   determining a flow rate profile of a well in a reservoir formation based on a uniform acid placement function;
   determining a reference location along a length of the well, wherein the reference location satisfies a condition of having a minimum ratio between a current injection front and a target injection front;
   determining a reference value based on the flow rate profile at the reference location along the length of the well;
   defining a target flow rate profile based on the reference value;

determining a pressure distribution along the length of the well based on the target flow rate profile;

determining an acid placement function that yields a prescribed shape of the flow rate profile for the well based on the target flow rate profile and the pressure distribution; and optimizing placement of an acid treatment along the length of the well, based on the acid placement function.

2. The method of claim 1, wherein the target flow rate profile is a target injection profile.

3. The method of claim 2, wherein the target injection profile and a permeability of an undamaged portion of the reservoir formation are uniform.

4. The method of claim 1, wherein the reference location along the length of the well satisfies a condition of having a minimum ratio between a current production front and a target production front.

5. The method of claim 4, wherein the target flow rate profile is a target production profile.

6. The method of claim 5, wherein the target production profile and a permeability of an undamaged portion of the reservoir formation are uniform.

7. The method of claim 5, wherein the target production profile is uniform and a permeability of an undamaged portion of the reservoir formation is non-uniform.

8. The method of claim 5, wherein the target production profile is non-uniform and a permeability of an undamaged portion of the reservoir formation is uniform.

9. A system for optimizing acid placement for well treatments, the system comprising:

at least one processor; and a memory coupled to the at least one processor and storing processor readable instructions, which when executed by the processor cause the processor to perform a plurality of operations, including operations to:

determine a flow rate profile of a well in a reservoir formation based on a uniform acid placement function;

determine a reference location along a length of the well, wherein the reference location satisfies a condition of having a minimum ratio between a current injection front and a target injection front;

determine a reference value based on the flow rate profile at the reference location along the length of the well;

define a target flow rate profile based on the reference value;

determine a pressure distribution along the length of the well based on the target flow rate profile;

determine an acid placement function that yields a prescribed shape of the flow rate profile for the well based on the target flow rate profile and the pressure distribution; and optimize placement of an acid treatment along the length of the well, based on the acid placement function.

10. The system of claim 9, wherein the target flow rate profile is a target injection profile.

11. The system of claim 10, wherein the target injection profile and a permeability of an undamaged portion of the reservoir formation are uniform.

12. The system of claim 9, wherein the reference location along the length of the well satisfies a condition of having a minimum ratio between a current production front and a target production front.

13. The system of claim 12, wherein the target flow rate profile is a target production profile.

14. The system of claim 13, wherein the target production profile and a permeability of an undamaged portion of the reservoir formation are uniform.

15. The system of claim 13, wherein the target production profile is uniform and a permeability of an undamaged portion of the reservoir formation is non-uniform.

16. The system of claim 13, wherein the target production profile is non-uniform and a permeability of an undamaged portion of the reservoir formation is uniform.

17. A non-transitory computer readable medium having instructions stored therein, which when executed by a computer cause the computer to perform a plurality operations, including operations to:

determine a flow rate profile of a well in a reservoir formation based on a uniform acid placement function;

determine a reference location along a length of the well, wherein the reference location satisfies a condition of having a minimum ratio between a current injection front and a target injection front;

determine a reference value based on the flow rate profile at the reference location along the length of the well;

define a target flow rate profile based on the reference value;

determine a pressure distribution along the length of the well based on the target flow rate profile;

determine an acid placement function that yields a prescribed shape of the flow rate profile for the well based on the target flow rate profile and the pressure distribution; and optimize placement of an acid treatment along the length of the well, based on the acid placement function.

* * * * *